(12) United States Patent
Kim et al.

(10) Patent No.: US 10,872,792 B2
(45) Date of Patent: Dec. 22, 2020

(54) MEASUREMENT DEVICE AND SEMICONDUCTOR MANUFACTURING SYSTEM INCLUDING THE SAME

(71) Applicant: Samsung Electronics Co., Ltd., Suwon-si (KR)

(72) Inventors: Sang-Soo Kim, Cheonan-si (KR); Sung-Kyu Park, Cheonan-si (KR); Seung-Hwan Kim, Asan-si (KR); Yun-Young Kim, Sejong-si (KR); Jun-Woo Park, Suwon-si (KR)

(73) Assignee: SAMSUNG ELECTRONICS., LTD., Suwon-si (KR)

( * ) Notice: Subject to any disclaimer, the term of this patent is extended or adjusted under 35 U.S.C. 154(b) by 234 days.

(21) Appl. No.: 15/894,217

(22) Filed: Feb. 12, 2018

(65) Prior Publication Data

US 2019/0080943 A1 Mar. 14, 2019

(30) Foreign Application Priority Data

Sep. 12, 2017 (KR) .................. 10-2017-0116654

(51) Int. Cl.
*H01L 21/67* (2006.01)
*G01N 21/95* (2006.01)
(Continued)

(52) U.S. Cl.
CPC ... *H01L 21/67253* (2013.01); *G01N 21/3581* (2013.01); *G01N 21/9501* (2013.01); *G01N 21/9505* (2013.01); *H01L 22/12* (2013.01)

(58) Field of Classification Search
CPC ............. H01L 21/67253; H01L 22/12; G01N 21/3581; G01N 21/9501; G01N 21/9505
See application file for complete search history.

(56) References Cited

U.S. PATENT DOCUMENTS 9,360,296 B2    6/2016  White et al.
9,508,610 B2 *  11/2016 Liu .................... H01L 22/12
(Continued)

FOREIGN PATENT DOCUMENTS

JP    2015-143666    8/2015
JP    2016-125976    7/2016
(Continued)

OTHER PUBLICATIONS

Park et al., In-situ thickness measurement of epoxy molding compound in semiconductor package products using a Terahertz-Time of Flight System, Apr. 30, 2019, NDT and E International, vol. 105., pp. 11-18. (Year: 2019).*

(Continued)

*Primary Examiner* — Christine S. Kim
(74) *Attorney, Agent, or Firm* — F. Chau & Associates, LLC

(57) ABSTRACT

A measurement device includes an emitter configured to emit an electromagnetic signal to an object to be measured. A first detector is disposed to measure a first portion of the electromagnetic signal that is reflected by the object to be measured. A second detector is disposed to measure a second portion of the electromagnetic signal that is transmitted through the object to be measured. The emitter is configured to emit the electromagnetic signal in a direction substantially perpendicular to a surface of the object to be measured.

13 Claims, 8 Drawing Sheets

(51) Int. Cl.
     *G01N 21/3581*    (2014.01)
     *H01L 21/66*       (2006.01)

(56) References Cited

U.S. PATENT DOCUMENTS

| | | | |
|---|---|---|---|
| 2008/0297770 A1 | 12/2008 | Kim et al. | |
| 2009/0314944 A1* | 12/2009 | Evans | G01N 21/3581 250/341.8 |
| 2016/0202179 A1 | 7/2016 | Nakanishi et al. | |
| 2018/0058938 A1* | 3/2018 | Akagawa | G01N 21/4133 |

FOREIGN PATENT DOCUMENTS

| | | |
|---|---|---|
| JP | 2017-020837 | 1/2017 |
| JP | 2017-062201 | 3/2017 |
| KR | 10-0892486 | 4/2009 |
| KR | 10-2015-0082318 | 7/2015 |
| KR | 10-1621366 | 5/2016 |
| KR | 10-1739628 | 5/2017 |

OTHER PUBLICATIONS

Ung et al., Dual-Mode Terahertz Time-Domain Spectroscopy System, Mar. 2013, vol. 3, pp. 216-220. (Year: 2013).*

* cited by examiner

MEASUREMENT DEVICE AND SEMICONDUCTOR MANUFACTURING SYSTEM INCLUDING THE SAME

CROSS-REFERENCE TO RELATED APPLICATION

This application claims the benefit of Korean Patent Application No. 10-2017-0116654, filed on Sep. 12, 2017, in the Korean Intellectual Property Office, the disclosure of which is incorporated by reference herein in its entirety.

TECHNICAL FIELD

The inventive concept relates to a semiconductor package, and more particularly, to a measurement device and a semiconductor package manufacturing system including the same.

DISCUSSION OF THE RELATED ART

Various methods have been proposed for accurate and rapid measurement of semiconductor dimensions at a low cost and without damaging or destroying the object to be measured. Among them, a terahertz measurement device using terahertz radiation has been used. Since photon energy of radiation in a terahertz region is less than band gap energy of non-metallic materials, photon energy of radiation in a terahertz region exhibits excellent penetrability to non-metallic materials, and thus, has emerged as an alternative to X-rays. Inspection systems using terahertz radiation may be used to identify material properties, inspect individual layers constituting materials, or create high-resolution images inside solid objects.

SUMMARY

A measurement device includes an emitter configured to emit an electromagnetic signal to an object to be measured. A first detector is disposed to measure a first portion of the electromagnetic signal that is reflected by the object to be measured. A second detector is disposed to measure a second portion of the electromagnetic signal that is transmitted through the object to be measured. The emitter is configured to emit the electromagnetic signal in a direction substantially perpendicular to a surface of the object to be measured.

A measurement device includes an emitter configured to emit an electromagnetic signal to an object to be measured. A first detector is spaced apart from the emitter with the object to be measured disposed therebetween. A second detector is spaced apart from the first detector with the object to be measured disposed therebetween. The second detector is adjacent to the emitter. The emitter is configured to emit the electromagnetic signal in a direction substantially perpendicular to a surface of the object to be measured.

A semiconductor package manufacturing system includes a package mounter configured to manufacture a semiconductor package including a package substrate, a semiconductor chip, and a mold. A mold measurement device is configured to measure a refractive index and a thickness of the mold. A transporter is configured to transfer the semiconductor package to the mold measurement device. The package mounter includes a package mounting station configured to mount the semiconductor chip on the package substrate and provide the mold to cover the semiconductor chip, and a manufacturing processor configured to control the package mounting station. The mold measurement device includes an emitter configured to emit an electromagnetic signal to the semiconductor package, a first detector disposed to measure a first portion of the electromagnetic signal reflected by the semiconductor package, a second detector disposed to measure a second portion of the electromagnetic signal transmitted by the semiconductor package, and a measurement processor configured to calculate the refractive index and the thickness of the mold based on the electromagnetic signal measured by the first and second detectors. The emitter is configured to emit the electromagnetic signal in a direction substantially perpendicular to a surface of the semiconductor package.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF THE EMBODIMENTS

Figure 1:
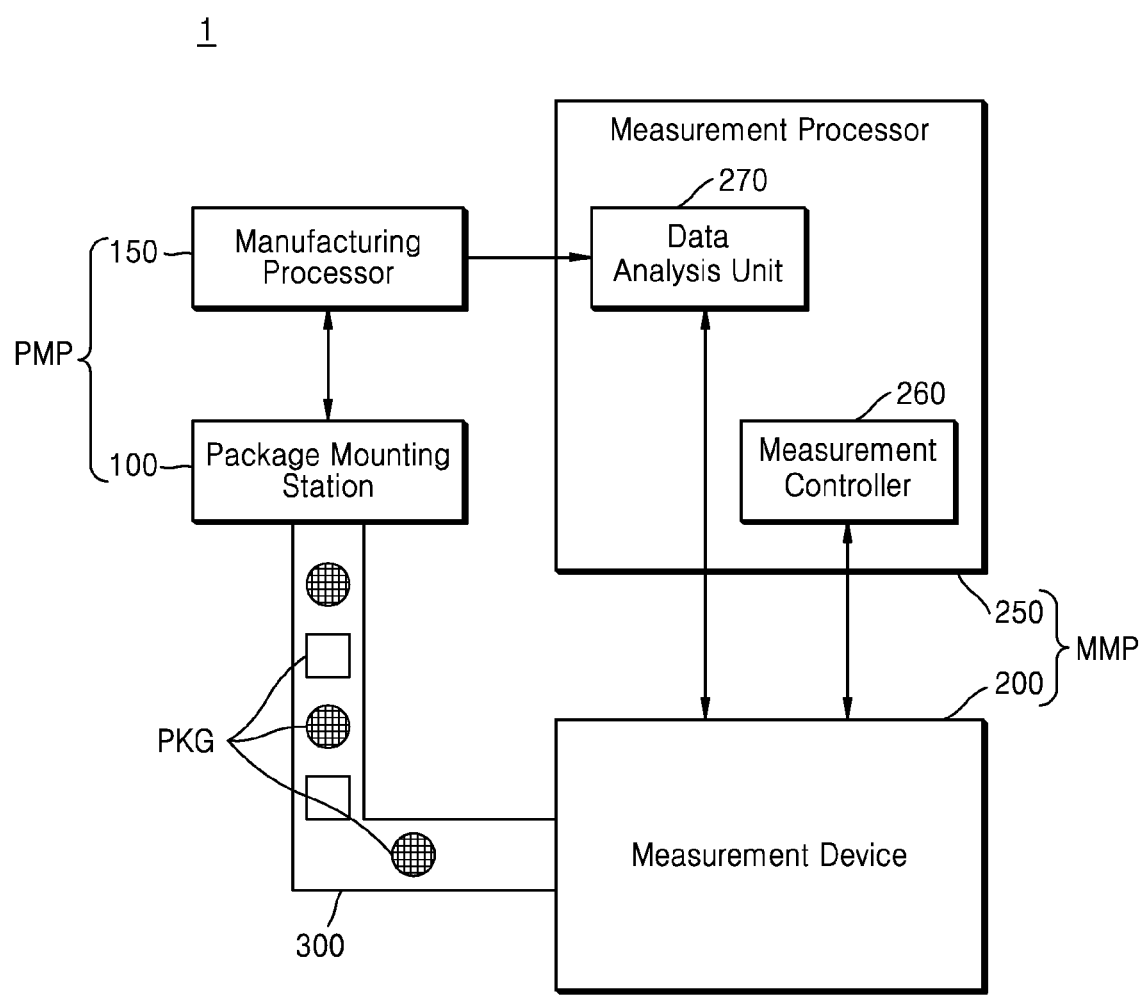
FIG. 1 is a block diagram illustrating a semiconductor package manufacturing system according to exemplary embodiments of the present inventive concept.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner. Identical reference numerals may be used for the same constituent elements throughout the various drawings, and to the extent that description thereof is omitted, it may be assumed that elements having the same reference numerals may have at least similar details.

FIG. 1 is a schematic block diagram showing a semiconductor package manufacturing system 1 according to exemplary embodiments of the present inventive concept.

Referring to FIG. 1, the semiconductor package manufacturing system 1 may include a package mounting unit PMP, a transporter 300, and a mold measurement unit MMP.

Figure 2:
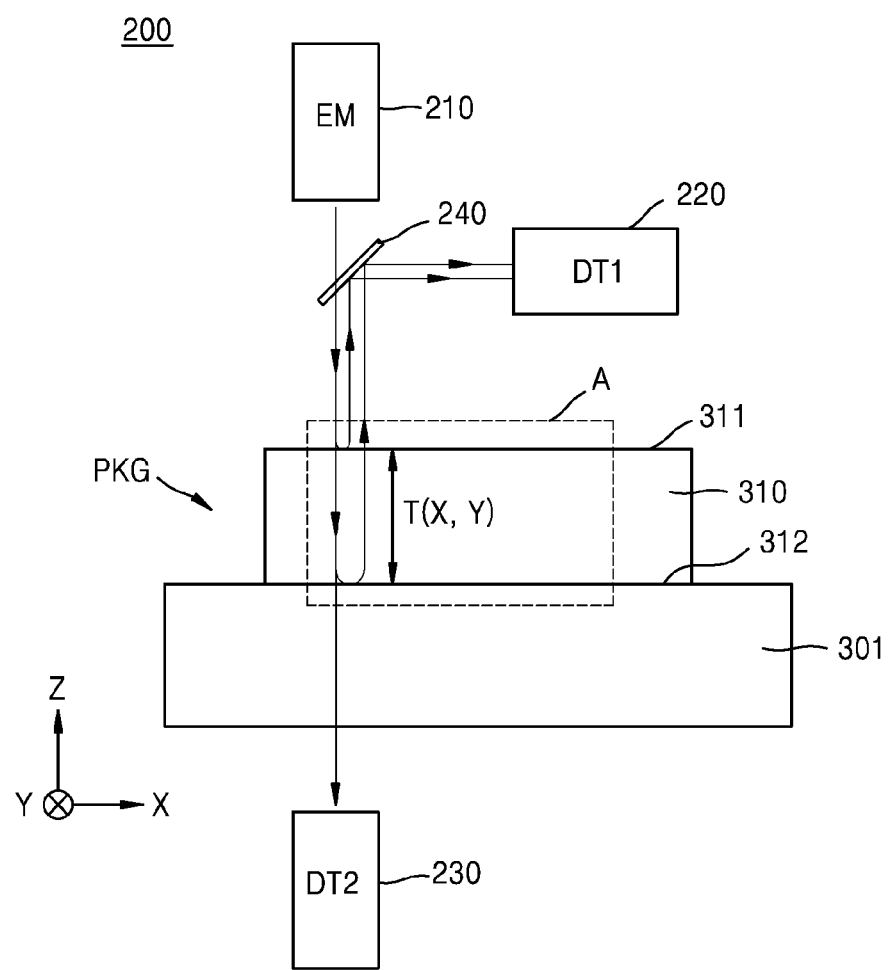
FIG. 2 is a cross-sectional view illustrating a measurement device according to exemplary embodiments of the present inventive concept.

According to some exemplary embodiments of the present inventive concept, the package mounting unit PMP may produce a semiconductor package PKG. The package mounting unit PMP may include a package mounting station 100 and a manufacturing processor 150. The package mounting station 100 may stack semiconductor chips on a package substrate and provide a mold 310 (e.g. as seen in FIG. 2) on the semiconductor chips and the package substrate. According to some exemplary embodiments of the present inventive concept, to produce the mold 310, a resin in a softened state may be applied on a certain region of the package substrate, spread by a plunger to cover the semiconductor chips, and hardened. However, the present invention is not limited to this particular approach. The mold 310 may cover and fix the semiconductor chips onto the package substrate. The mold 310 may protect the semiconductor chips from external impact or contaminants. The package mounting station 100 may produce and provide the semiconductor package PKG to the transporter 300.

According to some exemplary embodiments of the present inventive concept, the package mounting unit PMP may provide semiconductor packages PKG for entire semiconductor wafers. However, the present invention is not limited to providing such packages, and the package mounting unit PMP may provide individualized semiconductor packages for individual dies. A more detailed description of a structure of the semiconductor package PKG will be provided below with reference to FIG. 5.

The manufacturing processor 150 may control the package mounting station 100. The manufacturing processor 150 may include a computing device such as a workstation computer, a desktop computer, a laptop computer, and/or a tablet computer. The manufacturing processor 150 may include software that performs functions such as receiving feedback on manufacturing the semiconductor package PKG, receiving measurement data, and adjusting various processes.

The transporter 300 may be a sophisticated clean room transportation system capable of transporting the semiconductor package PKG produced at the package mounting station 100. The transporter 300 may include a conveyor system or the like. The transporter 300 may transport the semiconductor package PKG to the mold measurement unit MMP.

The mold measurement unit MMP may include a measurement device 200 and a measurement processor 250. The measurement device 200 may include one or more measurement stations configured to performing various measurements on the semiconductor package PKG. According to some exemplary embodiments of the present inventive concept, the mold measurement unit MMP may measure physical properties of the semiconductor package PKG. According to some exemplary embodiments of the present inventive concept, the mold measurement unit MMP may measure physical properties of the mold 310 included in the semiconductor package PKG. According to some exemplary embodiments of the present inventive concept, the mold measurement unit MMP may measure a position of a doped region, doping concentration of the doped region, conductivity, a vertical thickness, a refractive index, presence or absence of defects, or the like, of the semiconductor package PKG, but the present invention is not limited to having the MMP performing these measurements. According to some exemplary embodiments of the present inventive concept, the mold measurement unit MMP may measure the vertical thickness and/or the refractive index of the mold 310 of semiconductor package PKG, but the present invention is not limited to having the MMP perform these measurements either. The semiconductor package PKG may be loaded onto an appropriate measurement station depending on a measurement step. A configuration of the measurement device 200 will be described later in detail with reference to FIG. 2.

The measurement processor 250 may include a measurement controller 260 for controlling the measurement device 200 and a data analysis unit 270 for analyzing the measurement data received from the measurement device 200.

According to some exemplary embodiments of the present inventive concept, the data analysis unit 270 may compare the physical properties of the mold 310 of the semiconductor package PKG and/or the semiconductor package PKG with reference values or thresholds based on the measurement data. According to some exemplary embodiments of the present inventive concept, the data analysis unit 270 may compare the location of the doped region, the doping concentration of the doped region, the conductivity, the vertical thickness, the refractive index, the presence or absence of defects, or the like, of the semiconductor package PKG, with the reference values or the thresholds. According to some exemplary embodiments of the present inventive concept, the data analysis unit 270 may compare deviations in the vertical thickness of the semiconductor package PKG and/or the mold 310 with reference values or thresholds. The data analysis unit 270 may analyze the measurement data via a lookup function for the measurement data or by comparing the measurement data with existing online/offline data.

The data analysis unit 270 may analyze the received measurement data and provide a result thereof to the manufacturing processor 150. The manufacturing processor 150 may send a feedback signal to the package mounting station 100 based on the analyzed measurement data.

Feedback on manufacturing the semiconductor package by using the feedback signal may affect various parameters used in performance and/or selection of processes for providing the semiconductor package PKG. According to some exemplary embodiments of the present inventive concept, the manufacturing processor 150 may use the analyzed measurement data to perform adjustment of one or more process parameters, selection of a process set from a plurality of process sets, or the like. Examples of the process parameters may include temperature, pressure, duration time, or the like, but the present invention does not limit the types of process parameters to those listed herein.

The measurement device 200 may be controlled by the measurement processor 250. According to some exemplary embodiments of the present inventive concept, the measurement processor 250 is shown as being adjacent to the measurement device 200, but the present invention is not limited to this particular arrangement. According to some exemplary embodiments of the present inventive concept, the measurement processor 250 may be a computing device which includes one or more software products capable of controlling an operation of the measurement device 200, such as a workstation computer, a desktop computer, a laptop computer, and/or a tablet computer.

FIG. 2 is a schematic cross-sectional view of the measurement device 200 according to some exemplary embodiments of the present inventive concept.

Referring to FIG. 2, the measurement device 200 may include an emitter 210, a first detector 220, a second detector 230, and a splitter 240.

In FIG. 2, directions parallel to a top surface of the package substrate 301 and crossing each other may be denoted as a first direction X and a second direction Y, respectively, and a direction substantially perpendicular to the top surface of the package substrate 301 may be denoted as a third direction Z. The first and second directions X and Y may be substantially perpendicular to the third direction Z. In FIG. 2, a direction indicated by an arrow and the direction opposite thereto may be denoted as identical directions. Definitions of the above-mentioned directions may be the same for each of the drawings discussed herein.

The emitter 210 may generate an electromagnetic signal. The emitter 210 may be configured to emit the electromagnetic signal having a certain frequency and direct the electromagnetic signal to the semiconductor package PKG which corresponds to the object to be measured. In FIG. 2, the electromagnetic signals are shown by using arrows and a traveling direction of the electromagnetic signal may be substantially the same as the direction of the arrow. According to some exemplary embodiments of the present inventive concept, the emitter 210 may be configured to emit the electromagnetic signal in a direction substantially perpendicular to a surface of incidence of the object to be measured, for example, in the third direction Z.

According to some exemplary embodiments of the present inventive concept, the emitter 210 may generate the electromagnetic signal having a frequency in a terahertz band. According to some exemplary embodiments of the present inventive concept, the frequency of the electromagnetic signal that the emitter 210 can generate may be within a range of about 0.1 THz to about 10 THz, but the present invention is not limited to the use of these particular frequencies. According to some exemplary embodiments of the present inventive concept, the electromagnetic signal generated by the emitter 210 may have a wavelength of about 3 μm to about 3 mm. Since the electromagnetic signal in the terahertz band has a longer wavelength than visible light or infrared light, it may have stronger penetrability, and since it can be used even in the presence of interference of external light, there may be no need to perform a separate process when measuring the physical properties of the object to be measured.

According to some exemplary embodiments of the present inventive concept, the emitter 210 may include a single-cycle source and/or a pulse source, that is used in terahertz time domain spectroscopy, such as a Grapheme antenna, a gyrotron, a backward wave oscillator (BWO), an organic gas far infrared laser, a Schottky diode amplifier, a varactor amplifier, a quantum cascade laser, a free electron laser, a synchrotron light source, a light mixing source, a photo-Dember, and/or an optical rectification emitter. According to some exemplary embodiments of the present inventive concept, the emitter 210 may emit a pulsed laser beam having a short duration, for example, duration in a pico-second range. However, the inventive concept is not limited thereto and the emitter 210 may emit a continuous wave.

The semiconductor package PKG to be measured may include the package substrate 301 and the mold 310. The mold 310 may have a bottom surface 312 facing the package substrate 301 and in contact with the package substrate 301 and a top surface 311 of the mold 310, which is the opposite surface of the bottom surface 312. The top surface 311 of the mold 310 may correspond to a surface on which the electromagnetic signal emitted from the emitter 210 is incident upon. According to some exemplary embodiments of the present inventive concept, at least a portion of the mold 310 may be transparent to the terahertz wavelength band. In general, the electromagnetic signal in the terahertz band might not transmit through highly conductive objects such as metals, and may be subject to total reflection. Accordingly, the electromagnetic signal may transmit through a portion of the package substrate 301 where no wiring is formed.

The splitter 240 may be disposed between the emitter 210 and the semiconductor package PKG. The splitter 240 may be translucent to the electromagnetic signal in the terahertz wavelength band. The splitter 240 may reflect a first portion and transmit a second portion of the electromagnetic signal of a terahertz frequency. The splitter may transmit at least a portion of the electromagnetic signal emitted from the emitter 210 to the semiconductor package PKG. In addition, the splitter 240 may reflect at least some of the electromagnetic signal that has been reflected by the semiconductor package PKG. Referring to FIG. 2, only one splitter 240 is shown, but the present invention is not limited to having only a single splitter 240, and two or more splitters 240 may be provided.

The first detector 220 may measure the electromagnetic signal reflected by the semiconductor package PKG. The first detector 220 may measure the electromagnetic signal reflected by the top surface 311 of the mold 310 and the electromagnetic signal reflected by the bottom surface 312 of the mold 310. The first detector 220 may measure intensity, phase and/or arrival time of the electromagnetic signal reflected by the semiconductor package PKG. The second detector 230 may measure the electromagnetic signal transmitted through the semiconductor package PKG. The second detector 230 may measure the electromagnetic signal transmitted through the package substrate 301, or the package substrate 301 and the mold 310. The second detector 230 may measure intensity, phase and/or arrival time of the electromagnetic signal transmitted through the semiconductor package PKG.

According to some exemplary embodiments of the present inventive concept, the emitter 210, the first and second detectors 220 and 230 may make a two-dimensional (2D) movement relative to the semiconductor package PKG to be measured. According to some exemplary embodiments of the present inventive concept, the emitter 210, the first and second detectors 220 and 230, and the semiconductor package PKG may move relative to each other in directions parallel to the top surface of the package substrate 301. According to some exemplary embodiments of the present inventive concept, the measurement device 200 may move relative to the semiconductor package PKG, while the semiconductor package PKG is stationary. According to some exemplary embodiments of the present inventive concept, the semiconductor package PKG may move relative to the measuring device 200, while the measurement device 200 is stationary.

Figure 3A:
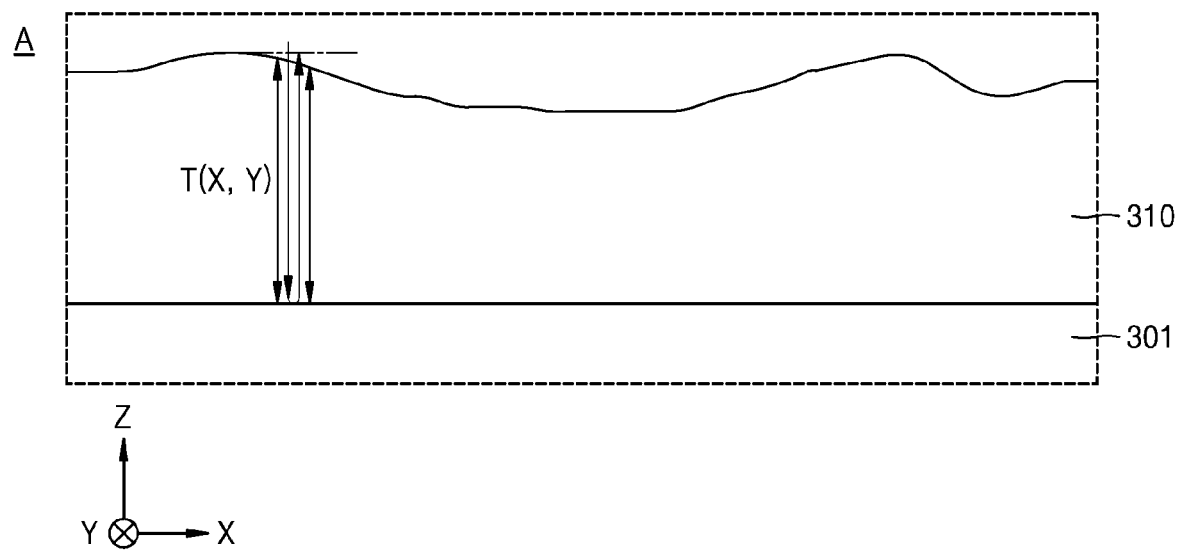
FIGS. 3A and 3B are enlarged cross-sectional views of region A in FIG. 2.
Figure 3B:
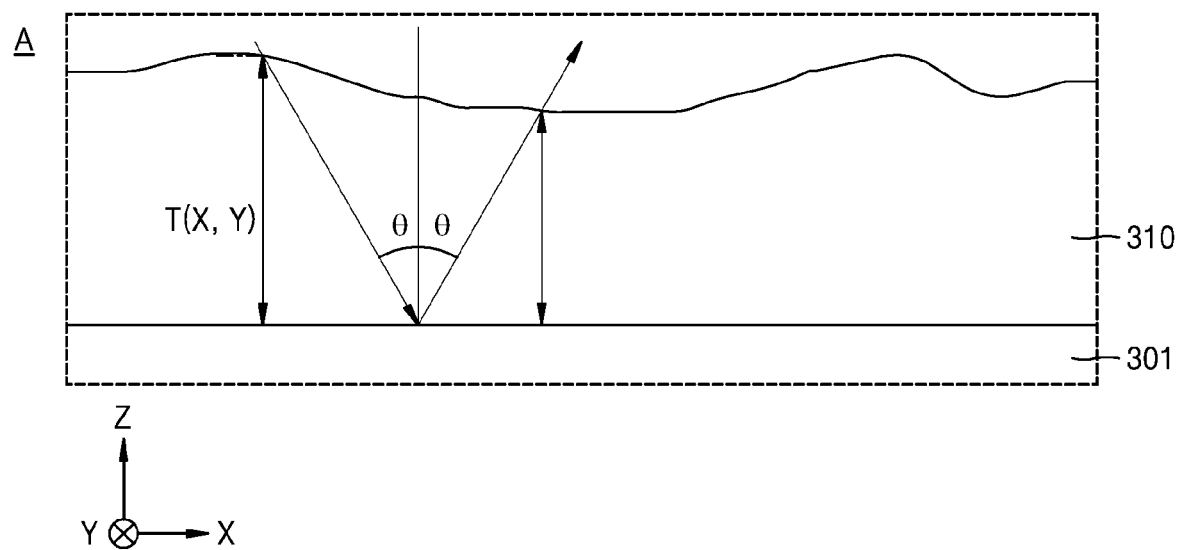

FIGS. 3A and 3B are enlarged cross-sectional views of a region A in FIG. 2 to illustrate an effect of some exemplary embodiments of the present inventive concept.

Referring to FIGS. 2 and 3A, the emitter 210, according to some exemplary embodiments of the present inventive concept, may emit the electromagnetic signal in a direction substantially perpendicular to the top surface of the mold 310. Here, the phrase "substantially perpendicular" may be understood to allow for some process errors.

In general, a vertical thickness $T(X,Y)$ of the mold 310 may have process dispersion. Accordingly, the vertical thickness $T(X,Y)$ of the mold 310, for example, a length in the third direction Z, may vary depending on positions in the first and second directions X and Y. As used herein, letters X and Y in a parentheses of the vertical thickness $T(X,Y)$ may indicate that the vertical thickness $T(X,Y)$ can be a function of positions (coordinates) in the first and second directions X and Y.

For example, the vertical thickness $T(X,Y)$ of the mold 310 at one position in the first and second directions X and Y may be different from the vertical thickness $T(X,Y)$ of the mold 310 at another position in the first and second directions X and Y. According to some exemplary embodiments of the present inventive concept, when the emitter 210 emits the electromagnetic signal in a direction substantially perpendicular to the top surface of the mold 310, a position at which the electromagnetic signal is incident on the mold 310 may be substantially the same as the position at which the electromagnetic signal reflected by the mold 310 is emitted from the mold 310. According to some exemplary embodiments of the present inventive concept, a portion of the top surface 311 of the mold 310 on which the electromagnetic signal emitted by the emitter 310 is incident may vertically overlap a portion of the bottom surface 312 of the mold 310 on which the electromagnetic signal emitted by the emitter 310 is incident. Accordingly, an optical path through which the electromagnetic signal incident on the top surface 311 of the mold 310 passes, until being reflected by the bottom surface 312 of the mold 310, may be substantially the same as an optical path through which the electromagnetic signal reflected by the bottom surface 312 of the mold 310 passes, until being emitted from the mold 310 to the outside. Thus, an influence due to the process dispersion of the vertical thickness T(X,Y) of the mold 310 may be reduced and a measurement error may be reduced.

Referring to FIG. 3B, a conventional emitter may emit the electromagnetic signal to the semiconductor package PKG at a first angle θ, that is substantially non-zero degrees angle, with respect to the normal of the top surface of the package substrate 301. A position where the electromagnetic signal emitted by the conventional emitter is incident on the top surface 311 of the mold 310 may be different from a position where the electromagnetic signal reflected by the bottom surface 312 of the mold 310 is emitted from the mold 310. Accordingly, the optical path through which the electromagnetic signal incident on the top surface 311 of the mold 310 passes, until being reflected by the bottom surface 312 of the mold 310, may be different from the optical path through which the electromagnetic signal reflected by the bottom surface 312 of the mold 310 passes, until being emitted from the mold 310 to the outside. Thus, unlike some exemplary embodiments of the present inventive concept, a measurement error may occur due to the influence of the process dispersion of the vertical thickness T(X,Y) of the mold 310.

Figure 4:
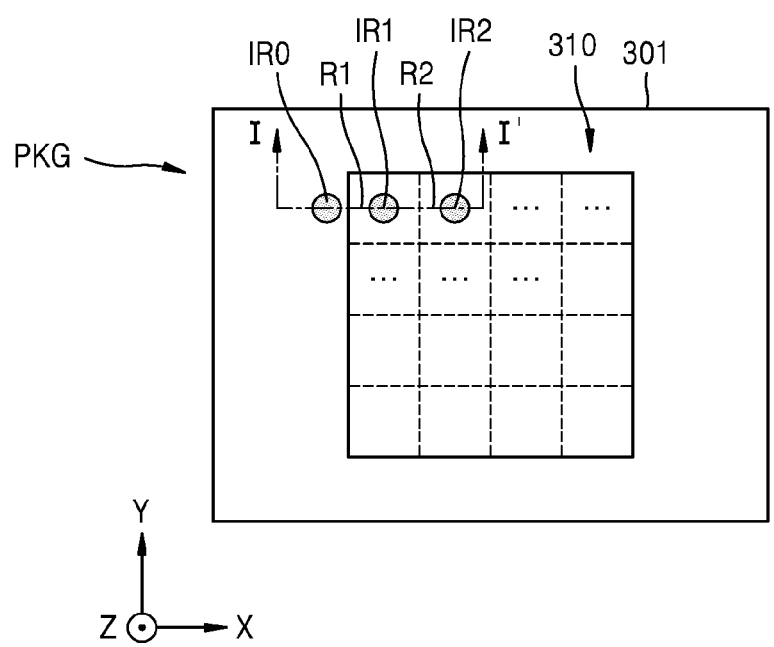
FIG. 4 is a plan view illustrating a measurement device according to exemplary embodiments of the present inventive concept.

FIG. 4 is a schematic plan view illustrating a measurement of the semiconductor package PKG according to some exemplary embodiments of the present inventive concept. For convenience of description, the measurement device 200 is omitted in FIG. 4.

Figure 5:
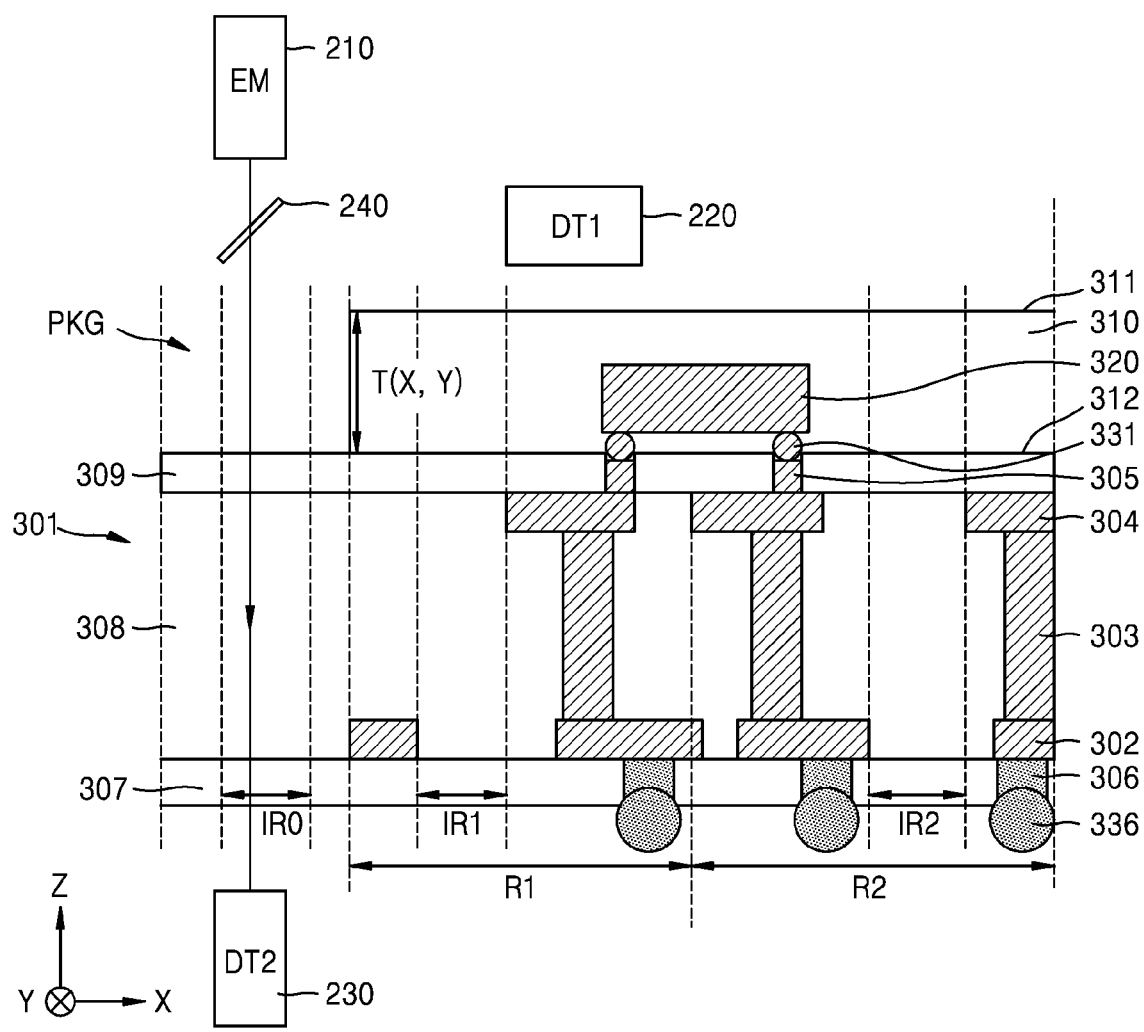
FIGS. 5 through 7 are cross-sectional views taken along line I-I' in FIG. 4.
Figure 6:
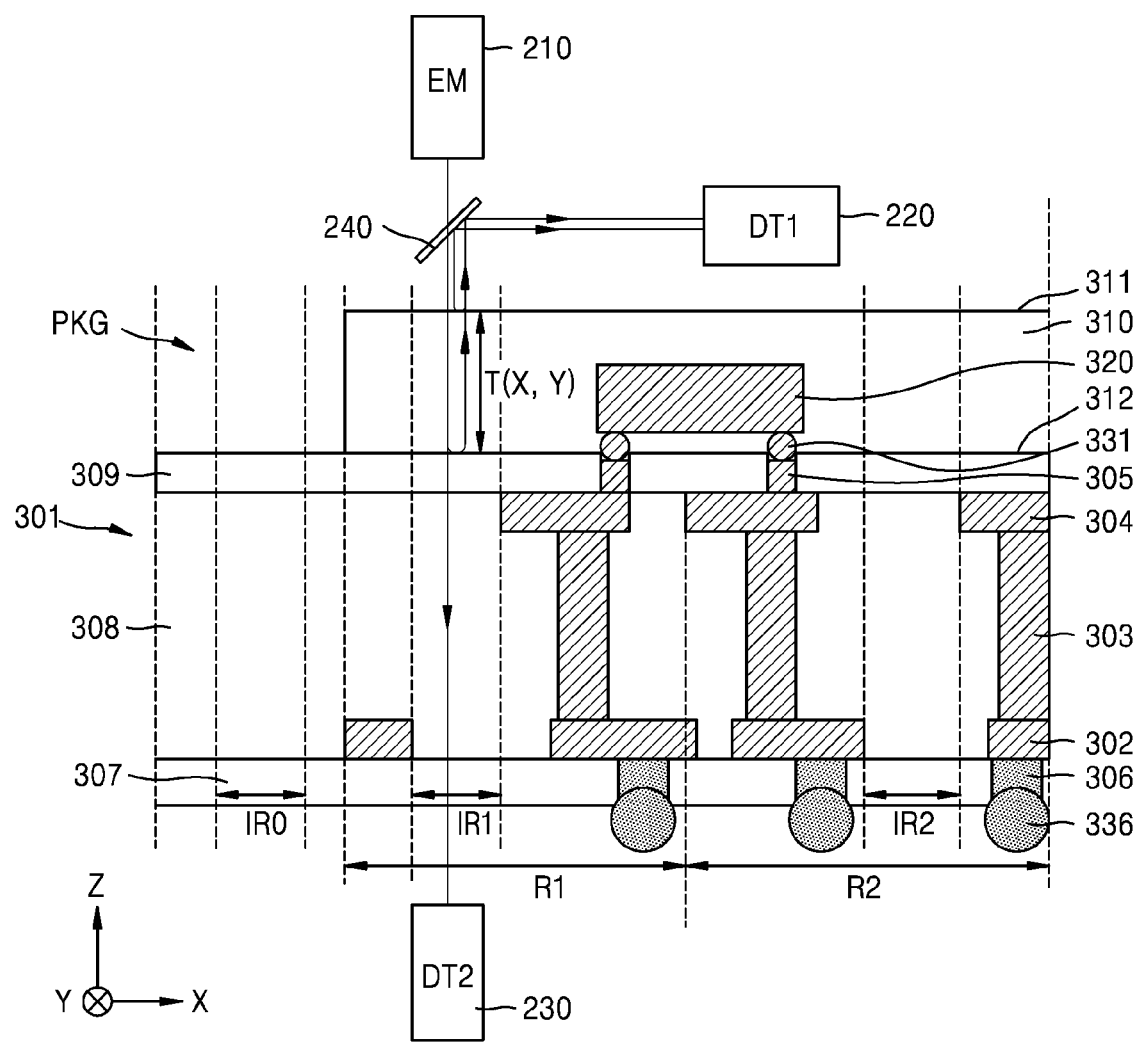
Figure 7:
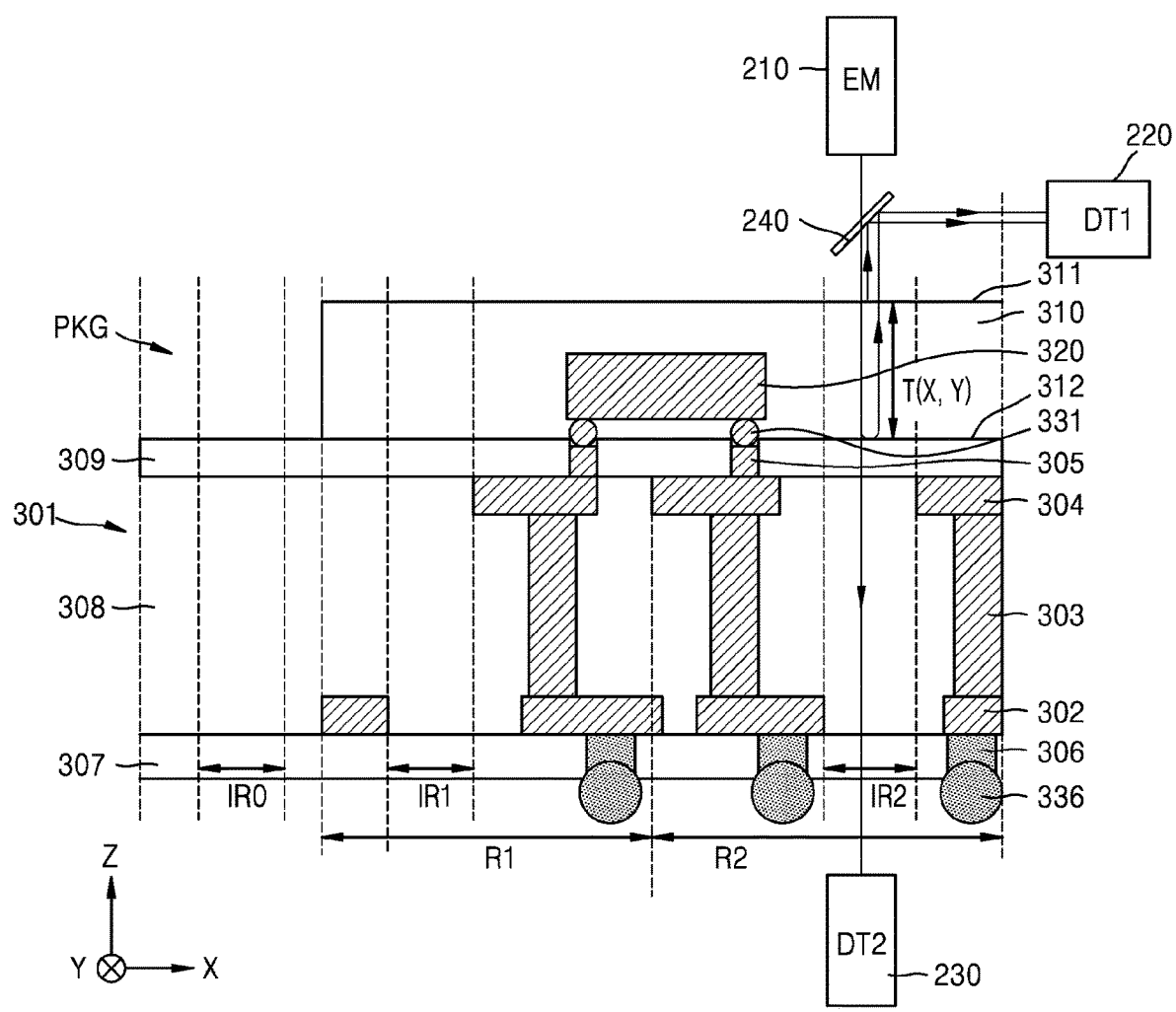

FIGS. 5 through 7 are cross-sectional views taken along line I-I' in FIG. 4.

Referring to FIGS. 4 and 5, the semiconductor package PKG may include a semiconductor chip 320, the mold 310, and the package substrate 301.

The package substrate 301 may be a printed circuit board (PCB) or a flexible substrate. The package substrate 301 may be formed by coating a conductive thin film on a plate that is obtained by compressing an insulating resin or the like to a certain thickness. The conductive thin film may be patterned to form circuit wirings and then, an electronic component such as a semiconductor chip may be mounted thereon via a bump or the like. The package substrate 301 may be a single-sided PCB where wirings are formed on only one side thereof, or a double-sided PCB where wirings are formed on both sides thereof.

The package substrate 301 may include a first conductive pattern 302, a conductive via 303, a second conductive pattern 304, a top contact layer 305, a bottom contact layer 306, a bottom protection layer 307, an insulating layer 308, and a top protection layer 309.

The insulating layer 308 may include a base layer and a plurality of insulating layers arranged on and under the base layer. The base layer may include resin and glass fibers. The resin included in the base layer may include phenol resin, epoxy resin, and/or polyimide. In some exemplary embodiments of the present inventive concept, the base layer may include flame retardant 4 (FR4), tetrafunctional epoxy, polyphenylene ether, epoxy/polyphenylene oxide, bismaleimide triazine (BT), thermount, cyanate ester, polyimide, prepreg, Ajinomoto build-up film (ABF), and/or liquid crystal polymer. The glass fiber included in the base layer may be one of reinforcing materials, and may be formed by making a bundle of several hundreds of glass filaments having a diameter of about 5 μm to about 15μ, into a fiber bundle, and by weaving the fiber bundle. The glass filament may be a processed ore product that mainly includes silica. The base layer including the glass fibers may have excellent heat resistance, mechanical strength, and electrical insulation. However, the present invention is not limited thereto, and in some exemplary embodiments of the present inventive concept, the base layer of the package substrate 301 may be omitted. The insulating layers arranged on and under the base layer may include resins that are substantially the same as those of the base layer.

The first and second conductive patterns 302 and 304 may be arranged on and under the base layer, respectively. The first and second conductive patterns 302 and 304 may extend in both the first and second directions X and Y. The conductive via 303 may penetrate the insulating layer 308 and extend in the third direction Z. The first and second conductive patterns 302 and 304 may be connected to each other by the conductive via 303. The first and second conductive patterns 302 and 304, and the conductive via 303 may each include a conductive material. The first and second conductive patterns 302 and 304, and the conductive via 303 may each include copper (Cu), aluminium (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), and graphene, and/or a metal alloy or other combination thereof.

The top protection layer 309 may be on top surfaces of the second conductive pattern 304 and the insulating layer 308. The top protection layer 309 may be an insulating coating film. The top protection layer 309 may be, for example, a solder resist layer. The top protection layer 309 may include a contact hole exposing a portion of the top surface of the second conductive pattern 304. The top protection layer 309 may protect the second conductive pattern 304 and prevent an occurrence of a bridge phenomenon between the second conductive patterns 304.

The top contact layer 305 may be inside the contact hole of the top protection layer 309. The top contact layer 305 may be connected to the second conductive pattern 304. A side surface of the top contact layer 305 may contact a side wall of the contact hole. The top contact layer 305 may include a conductive material. The top contact layer 305 may include Cu, Al, Ni, Ag, Au, Pt, Sn, Pb, Ti, Cr, Pd, In, Zn, C, and/or graphene, and/or a metal alloy or other combination thereof. According to some exemplary embodiments of the present inventive concept, when the top contact layer 305 includes Ni, the top contact layer 305 may contain phosphorus (P) to prevent oxidation of Ni included therein. For example, the top contact layer 305 may include about 5% to about 12% by weight of phosphorus (P). According to some exemplary embodiments of the present inventive concept, a width of the top contact layer 305 may be less than that of the second conductive pattern 304.

The bottom protection layer 307 may be disposed under the insulating layer 308. The bottom protection layer 307 may have a composition similar to that of the top protection layer 309. The bottom protection layer 307 may include a bottom contact hole exposing a bottom surface of the first conductive pattern 302.

The bottom contact layer 306 may be inside the bottom contact hole of the bottom protection layer 307. A top surface of the bottom contact layer 306 may be in contact with the first conductive pattern 302. A side surface of the bottom contact layer 306 may contact a side wall of the bottom contact hole. Side walls of the bottom protection layer 307 which define the bottom contact holes may cover the side surfaces of the bottom contact layer 306. The bottom contact layer 306 may include substantially the same material as the top contact layer 305.

An external connection terminal 336 may be connected to the bottom contact layer 306. The external connection terminal 336 may include Cu, Al, Ni, Ag, Au, Pt, Sn, Pb, Ti, Cr, Pd, In, Zn, C, and/or graphene, and/or a metal alloy or other combination thereof. The external connection terminal 336 may be, for example, a solder ball or a solder bump. The external connection terminal 336 may electrically connect the semiconductor package PKG to an external device. Some external connection terminals 336 may be provided for signal transmission. Other external connection terminals 336 may be provided for transmitting operating power and input/output power, or for providing ground potential to the package substrate 301.

The semiconductor chips 320 may be stacked on the package substrate 301. The semiconductor chip 320 may be a logic chip, a memory chip, or a combination thereof. When the semiconductor chip 320 is the memory chip, the semiconductor chip 320 may be a DRAM, an SRAM, a flash memory, an EEPROM, a PRAM, an MRAM, or a RRAM. The semiconductor package PKG, in which these memory chips are mounted on the package substrate 301, may constitute a memory module. The semiconductor chip 320 may be mounted on the package substrate 301 in a form of a package sealed by the mold 310. According to some exemplary embodiments of the present inventive concept, a buffer chip may be further disposed on the package substrate 301, but the present invention is not limited thereto.

A bonding bump 331 may be disposed between the semiconductor chip 320 and the package substrate 301. The bonding bump 331 may electrically connect the package substrate 301 and the semiconductor chip 320. The bonding bump 331 may include a material substantially the same as that of the external connection terminal 336 as a conductive material. However, the present invention is not limited thereto, and a bonding wire may be disposed so as to connect the semiconductor chip 320 and the package substrate 301.

Referring to FIG. 5, the semiconductor package PKG is shown as having an external connection terminal 336 in a form of a solder or a bump, but the present invention is not limited thereto. For example, the semiconductor package PKG may be of a slot-type. When the semiconductor package PKG is of the slot-type, the semiconductor package PKG may include a dual inline memory module (DIMM), a small outline DIMM (SO-DIMM), an unbuffered-DIMM, and/or a fully buffered DIMM (FB-DIMM). In this case, the semiconductor package PKG may include a plurality of external connection pins or tabs which are aligned to each other and spaced apart from each other at the bottom end thereof.

According to some exemplary embodiments of the present inventive concept, a plurality of partition regions R1, R2, . . . may be defined in the mold 310 of the semiconductor package PKG. According to some exemplary embodiments of the present inventive concept, the plurality of partition regions R1, R2, . . . may be ranges of areas where one substantially identical refractive index is applied in a corresponding partition region when the thickness of the mold 310 is measured. According to some exemplary embodiments of the present inventive concept, the mold 310 may be evenly divided by a plurality of partition regions R1, R2, . . . , but the present invention is not limited thereto. According to some exemplary embodiments of the present inventive concept, the plurality of partition regions R1, R2, . . . may have an identical horizontal size, but the present invention is not limited thereto.

A plurality of transmission regions IR0, IR1, IR2, . . . may be defined on the semiconductor package PKG. According to some exemplary embodiments of the present inventive concept, each of the plurality of partition regions R1, R2, . . . may include one or more of the transmission regions IR1, IR2, . . . , respectively. According to some exemplary embodiments of the present inventive concept, the transmission regions IR0, IR1, IR2, . . . may be regions where the electromagnetic signal of the terahertz frequency transmits the semiconductor package PKG. According to some exemplary embodiments of the present inventive concept, the transmission regions IR0, IR1, IR2, . . . may be regions where the first and second conductive patterns 302 and 304, and the conductive via 303 are not formed. According to some exemplary embodiments of the present inventive concept, the transmission regions IR0, IR1, IR2, . . . may include only insulating materials. Referring to FIG. 4, it is shown that one transmission region is included in one partition region, but it is also possible that two or more transmission regions are included.

Figure 8:
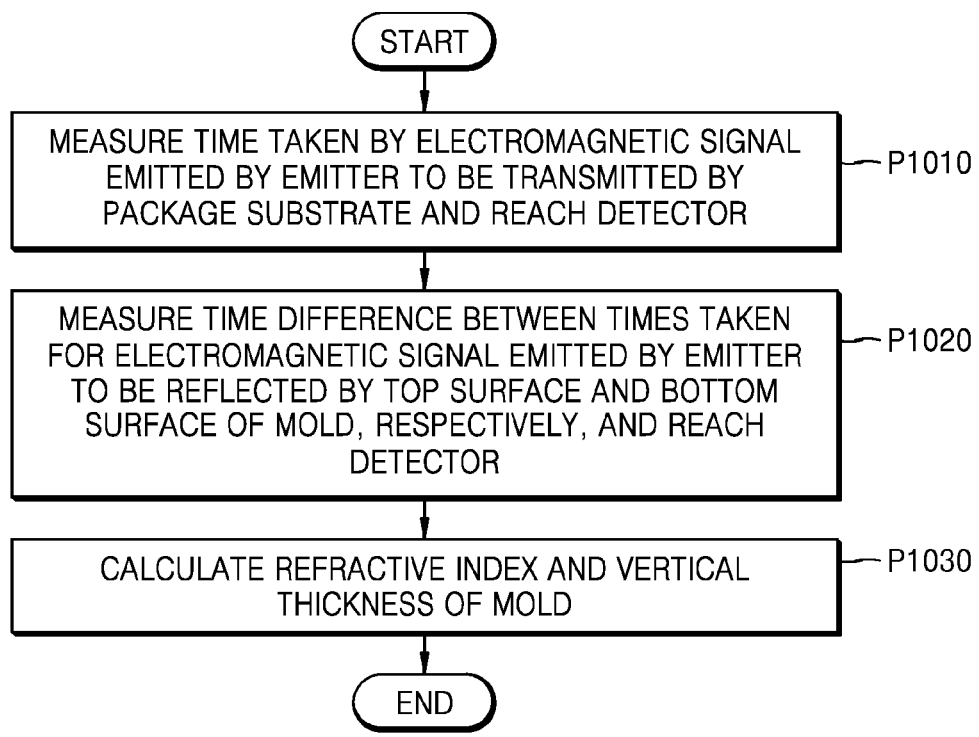
FIG. 8 is a flowchart illustrating a method of measuring a vertical thickness of a mold by using a measurement device according to exemplary embodiments of the present inventive concept.

FIG. 8 is a flowchart illustrating a method of measuring the vertical thickness T(X,Y) of the mold 310 by using the measurement device 200 according to some exemplary embodiments of the present inventive concept.

Referring to FIGS. 4, 5, and 8, in process P1010, the emitter 210 may emit the electromagnetic signal to the zeroth transmission region IR0. The zeroth transmission region IR0 may be a region, where the first and second conductive patterns 302 and 304, and the conductive via 303 are not formed, among the regions horizontally spaced apart from the mold 310. The second detector 230 may detect the electromagnetic signal transmitted through the zeroth transmission region IR0 of the semiconductor package PKG. The second detector 230 may calculate the time taken by the electromagnetic signal emitted from the emitter 210 to transmit the semiconductor package PKG and reach the second detector 230.

Referring to FIGS. 2, 4, 6, and 8, in process P1020, the first detector 220 may calculate a difference between a time taken by the electromagnetic signal emitted by the emitter 210 to be reflected by the top surface 311 of the mold 310 and reach the first detector 220, and a time taken by the electromagnetic signal emitted by the emitter 210 to be reflected by the bottom surface 312 of the mold 310 and reach the first detector 220. The second detector 230 may measure a time taken by the electromagnetic signal emitted by the emitter 210 to reach the second detector 230 after having transmitted through the package substrate 301 and the mold 310. Accordingly, the measurement device 200 may obtain a first reflection time difference $\Delta tr1(X,Y)$ and a first transmission time difference $\Delta tt1$ to be described below. In process P1030, the measurement processor (refer to 250 in FIG. 1) may obtain the refractive index and the vertical thickness T(X,Y) of the mold 310 based on the first reflection time difference Δtr1(X,Y) and the first transmission time difference Δtt1.

Referring to FIGS. 2 and 6, the measurement device 200 and the semiconductor package PKG may move relative to each other such that the emitter 210 is arranged in the first partition region R1 of the mold 310.

According to some exemplary embodiments of the present inventive concept, the first detector 220 may measure the first reflection time difference Δtr1(X, Y) that may be a difference between the time taken by the electromagnetic signal emitted by the emitter 210 to be reflected by the top surface of the mold 310 on the first partition region R1 and by the splitter 240, and reach the first detector 220, and the time taken by the electromagnetic signal emitted by the emitter 210 to be reflected by the bottom surface of the mold 310 and by the splitter 240 in the first partition region R1, and reach the first detector 220. According to some exemplary embodiments of the present inventive concept, the portion of the top surface 311 of the mold 310 on which the electromagnetic signal reaches may vertically overlap the portion of the bottom surface 312 of the mold 310 on which the electromagnetic signal reaches. In this case, the first reflection time difference Δtr1(X,Y) may be defined by Formula 1 below.

$$\Delta tr1(X, Y) = \frac{2n1 T(X, Y)}{c} \qquad \text{[Formula 1]}$$

Here, a first refractive index n1 may be the refractive index of the mold 310 in the first partition region R1 and c may correspond to the speed of light in the air.

As described above, the measurement device 200 may move in the first and second directions X and Y relative to the semiconductor package PKG. According to some exemplary embodiments of the present inventive concept, the measurement device 200 may measure the first reflection time difference Δtr1(X,Y) in real time for the whole first partition region R1. Since the vertical thickness T(X,Y) of the mold 310 is a position function in the first and second directions X and Y, the first reflection time Δtr1(X,Y) may also be a position function in the first and second directions X and Y.

In the first partition region R1 excluding the first transmission region IR1, at least one of the first conductive pattern 302, the conductive via 303 and the second conductive pattern 304 may be formed. Thus, the electromagnetic signal may be totally reflected and might not reach the second detector 230. According to some exemplary embodiments of the present inventive concept, in the first partition region R1 excluding the first transmission region IR1, the time taken by the electromagnetic signal emitted from the first emitter 210 to reach the second detector 230 might not be measured. When the measurement device 200 horizontally moves and the emitter 210 emits the electromagnetic signal to the first transmission region IR1, the second detector 230 may measure the time taken by the electromagnetic signal emitted from the emitter 210 to transmit the mold 310 and the package substrate 301 and reach the second detector 230.

When the refractive index of the mold in the first transmission region IR1 is referred to as the first refractive index n1, the first transmission time difference Δtt1 may be defined by Formula 2 below, which is a difference between times taken by the electromagnetic signal to transmit the zeroth and first transmission regions IR0 and IR1, and be detected by the second detector 230, respectively.

$$\Delta tt1 = \frac{n1 T(X, Y) - T(X, Y)}{c} = \frac{(n1 - 1) T(X, Y)}{c} \qquad \text{[Formula 2]}$$

Here, the first refractive index n1 may be calculated from the first transmission time difference Δtt1 and the first reflection time difference Δtr1(X,Y) in the first transmission region IR1, as shown in Formula 3 below.

$$n1 = \frac{1}{1 - 2\frac{\Delta tt1}{\Delta tr1(X, Y)}} \qquad \text{[Formula 3]}$$

According to some exemplary embodiments of the present inventive concept, when the physical properties of the mold 310 is measured, the first refractive index n1 obtained in the first transmission region IR1 may be applied to the whole first partition region R1. Accordingly, the measurement processor (refer to 250 in FIG. 1) may obtain the vertical thickness T(X,Y) of the mold 310 in the first partition region R1 as shown in Formula 4 below.

$$T(X, Y) = c \frac{\Delta tr1(X, Y)}{2n1} \qquad \text{[Formula 4]}$$

In addition, referring to FIGS. 2, 4, and 7, the measurement device 200 and the semiconductor package PKG may move relative to each other such that the emitter 210 is arranged on the second partition region R2 of the mold 310.

The first detector 220 may obtain a second reflection time difference Δtr2(X,Y) in the same manner as in the first reflection time difference Δtr1(X,Y). The first detector 220 may measure the second reflection time difference Δtr2(X, Y) that is a difference between a time taken by the electromagnetic signal emitted by the emitter 210 to be reflected by the top surface 311 of the mold 310 in the second partition region R2 and by the splitter 240, and reach the first detector 220, and a time taken by the electromagnetic signal emitted by the emitter 210 to be reflected by the bottom surface 312 of the mold on the second partition region R2 and by the splitter 240, and reach the first detector 220. According to some exemplary embodiments of the present inventive concept, the portion of the top surface 311 of the mold 310 on which the electromagnetic signal reaches may vertically overlap the portion of the bottom surface 312 of the mold 310 on which the electromagnetic signal reaches. Here, the second reflection time difference Δtr2(X, Y) may be given by Formula 5 below.

$$\Delta tr2(X, Y) = \frac{2n2 T(X, Y)}{c} \qquad \text{[Formula 5]}$$

Here, n2 may be the refractive index of the mold 310 in the second partition region R2 and the c may correspond to the speed of light in the air.

When the refractive index of the mold 310 in the second transmission region IR2 or the n2 is referred to as a second refractive index similarly to the above description, the second transmission time difference Δtt2 may be defined by Formula 6 below, which is the difference between the time taken by the electromagnetic signal to transmit the zeroth transmission region IR0 and reach the second detector 230, and is a time obtained with reference to FIG. 5, and a time taken by the electromagnetic signal to transmit the second transmission region IR2 and reach the second detector 230, and is a time obtained with reference to FIG. 7.

$$\Delta tt2 = \frac{n2T(X, Y) - T(X, Y)}{c} = \frac{(n2-1)T(X, Y)}{c} \quad \text{[Formula 6]}$$

Here, the c may correspond to the speed of light in the air. The second refractive index n2 may be calculated from the second transmission time difference Δtt2 and the second reflection time difference Δtr2(X,Y) in the second transmission region IR2 as shown in Formula 7 below.

$$n2 = \frac{1}{1 - 2\frac{\Delta tt2}{\Delta tr2(X, Y)}} \quad \text{[Formula 7]}$$

According to some exemplary embodiments of the present inventive concept, when the physical properties of the mold 310 is measured, the second refractive index n2 obtained in the second transmission region IR2 may be applied to the whole second partition region R2. Accordingly, the measurement processor (e.g. 250 in FIG. 1) may obtain the vertical thickness T(X,Y) of the mold 310 in the second partition region R2 as shown in Formula 8 below.

$$T(X, Y) = c\frac{\Delta tr2(X, Y)}{2n2} \quad \text{[Equation 8]}$$

Accurate values of the vertical thickness T(X,Y) of the whole mold 310 may be obtained in real time by applying substantially the same method as described above with reference to FIGS. 4 through 7 to other partition regions.

Conventional measurement devices using a terahertz signal measure a thickness by using Formula 4 and applying an already known refractive index to a mold. However, in general, different portions of the mold may have different refractive indices and thus, inaccurate thickness distribution data of the mold may be obtained when a uniform refractive index is applied to the entirety of the mold. An unevenness of the mold beyond a reference value may lead to a reduction in a yield due to warpage of a substrate during subsequent processes and a poor contact due to height unevenness of an external connection terminal, or the like. Thus, when reliability in judgment is reduced with respect to the unevenness of the mold due to a process failure, the reliability in manufacturing a semiconductor package may be deteriorated.

According to some exemplary embodiments of the present inventive concept, an accurate vertical thickness of the mold 310 may be measured in real time by physically dividing the mold 310 horizontally and applying the refractive index measured in a portion of a corresponding partition region to the entirety of the corresponding partition region. Further, since an error due to the process dispersion of a vertical thickness of the mold 310 is reduced by vertically emitting an electromagnetic signal to the mold 310, a more accurate vertical thickness of the mold 310 may be obtained.

A measurement error in the vertical thickness of the mold of the conventional measurement device may be in a range of about 20 to 30 μm. However, according to various exemplary embodiments of the present inventive concept, the measurement error in the vertical thickness of the mold 310 may be reduced to about 2 to about 3 μm.

Exemplary embodiments described herein are illustrative, and many variations can be introduced without departing from the spirit of the disclosure or from the scope of the appended claims. For example, elements and/or features of different exemplary embodiments may be combined with each other and/or substituted for each other within the scope of this disclosure and appended claims.

What is claimed is:

1. A measurement device comprising:
   an emitter configured to emit an electromagnetic signal to an object to be measured;
   a first detector disposed to measure a first portion of the electromagnetic signal that is reflected by a first surface of the object to be measured and a second portion of the electromagnetic signal that is reflected by a second surface of the object to be measured;
   a second detector disposed to measure a third portion of the electromagnetic signal that is transmitted through the object to be measured, wherein the emitter is configured to emit the electromagnetic signal in a direction substantially perpendicular to a surface of the object to be measured; and
   a processor configured to calculate a refractive index of the object to be measured based on the electromagnetic signal measured by the first detector and the second detector,
   wherein the first surface of the object to be measured is adjacent to the emitter, wherein the first detector is further configured to measure a first time difference defined as a difference between a time taken for the first portion of the electromagnetic signal to be reflected by the first surface of the object and reach the first detector and a time taken for the second portion of the electromagnetic signal to be reflected by the second surface of the object to be measured and reach the first detector, and herein the second detector is further configured to measure a second time difference defined as a difference between a time taken for the third portion of the electromagnetic signal to be transmitted by a mold and a package substrate and reach the second detector and a time taken for the third portion of the electromagnetic signal to be transmitted by the package substrate and reach the second detector.

2. The measurement device of claim 1, wherein the processor is configured to calculate a thickness of the object to be measured based on the first time difference, the second time difference, and the calculated refractive index.

3. The measurement device of claim 1, wherein the emitter, the first detector, and the second detector are each configured to move relative to the object to be measured in a direction parallel to a plane of the first measurement surface.

4. The measurement device of claim 1, wherein a portion of the first measurement surface that the electromagnetic signal reaches, vertically overlaps a portion of the second measurement surface that the electromagnetic signal reaches.

5. A measurement device comprising:
   an emitter configured to emit an electromagnetic signal to an object to be measured;

a first detector spaced apart from the emitter with the object to be measured disposed therebetween; and a second detector spaced apart from the first detector with the object to be measured disposed therebetween, the second detector being adjacent to the emitter, wherein the emitter is configured to emit the electromagnetic signal in a direction substantially perpendicular to a surface of the object to be measured, wherein the object to be measured has a first measurement surface adjacent to the emitter and a second measurement surface opposite to the first measurement surface, wherein the first detector is further configured to measure a first time difference defined as a difference between a time taken for a first portion of the electromagnetic signal to be reflected by the first measurement surface and reach the first detector and a time taken for the first portion of the electromagnetic signal to be reflected by the second measurement surface and reach the first detector, and wherein the second detector is further configured to measure a second time difference defined as a difference between a time taken for a second portion of the electromagnetic signal to be transmitted by a mold and a package substrate and reach the second detector and a time taken for the second portion of the electromagnetic signal to be transmitted by the package substrate and reach the second detector.

6. The measurement device of claim 5, further comprising a splitter disposed between the emitter and the object to be measured, configured to transmit at least a portion of the electromagnetic signal emitted by the emitter, and configured to reflect at least a portion of the first portion of the electromagnetic signal reflected by the object to be measured.

7. The measurement device of claim 5, wherein the object to be measured comprises:
the package substrate extending in a horizontal direction and having a consistent vertical thickness;
a semiconductor chip disposed on the package substrate; and
the mold disposed on the package substrate and covering the semiconductor chip,
wherein the first detector, the second detector, and the emitter are each configured to move relative to the object to be measured in the horizontal direction with respect to the object to be measured.

8. The measurement device of claim 7, wherein the measurement device is configured to measure a thickness and a refractive index of the mold.

9. The measurement device of claim 7, wherein the first detector is further configured to measure the first portion of the electromagnetic signal reflected by a top surface and a bottom surface of the mold.

10. The measurement device of claim 7, wherein the second detector is configured to measure the second portion of the electromagnetic signal transmitted by the package substrate, or measure the second portion of the electromagnetic signal transmitted by the package substrate and the mold.

11. A semiconductor package manufacturing system comprising:
a package mounter configured to manufacture a semiconductor package including a package substrate, a semiconductor chip, and a mold;
a mold measurement device configured to measure a refractive index and a thickness of the mold; and
a transporter configured to transfer the semiconductor package to the mold measurement device,
wherein the package mounter comprises:
a package mounting station configured to mount the semiconductor chip on the package substrate and provide the mold to cover the semiconductor chip; and
a manufacturing processor configured to control the package mounting station, and the mold measurement device comprises:
an emitter configured to emit an electromagnetic signal to the semiconductor package;
a first detector disposed to measure a first portion of the electromagnetic signal reflected by the semiconductor package;
a second detector disposed to measure a second portion of the electro magnetic signal transmitted by the semiconductor package; and
a measurement processor configured to calculate the refractive index and the thickness of the mold based on the electromagnetic signal measured by the first and second detectors,
wherein the emitter is configured to emit the electromagnetic signal in a direction substantially perpendicular to a surface of the semiconductor package,
wherein the mold has a bottom surface in contact with the package substrate and a top surface opposite the bottom surface,
wherein the first detector is further configured to measure a first time difference defined as a difference between a time taken by the first portion of the electromagnetic signal reflected by a portion of the top surface to reach the first detector and a time taken by the first portion of the electromagnetic signal reflected by a portion of the bottom surface vertically overlapping the portion of the top surface to reach the first detector, and
wherein the second detector is further configured to measure a second time difference defined as a difference between a time taken by the second portion of the electromagnetic signal transmitted by the mold and the package substrate to reach the second detector and a time taken by the second portion of the electromagnetic signal transmitted through the package substrate to reach the second detector.

12. The semiconductor package manufacturing system of claim 11, wherein the emitter is configured to emit the electromagnetic signal at a frequency in a range of about 0.1 THz to about 10 THz.

13. The semiconductor package manufacturing system of claim 11, wherein the measurement processor is further configured to transmit a feedback signal to the manufacturing processor, the feedback signal being based on a distribution of the calculated thickness of the mold.

* * * * *